COMPACT STRIP-LINE TYPE MIXER USING HYBRID RING

Filed Oct. 22, 1965

INVENTORS
RICHARD E. BLIXT
JOSEPH C. GUNDRY

BY Mueller, Aichele & Rauner

ATTORNEYS

United States Patent Office 3,512,091
Patented May 12, 1970

3,512,091
COMPACT STRIP-LINE TYPE MIXER USING HYBRID RING

Richard E. Blixt, Tempe, and Joseph C. Gundry, Phoenix, Ariz., assignors to Motorola, Inc., Franklin Park, Ill., a corporation of Illinois Filed Oct. 22, 1965, Ser. No. 500,635
Int. Cl. H04b *1/26*
U.S. Cl. 325—446 2 Claims

ABSTRACT OF THE DISCLOSURE

A pair of insulating boards are pressed together with at least one of the boards having conductive layers thereon. One of the conductive layers includes a hybrid ring adapted to receive incoming signals and locally generated signals. A pair of output connections on the hybrid ring are immediately adjacent a pair of recesses in one of the boards which receive a pair of diodes. Diodes are of the coaxial type having an enlarged center portion with elongated contact end portions. An output circuit extends from the recesses and is connected to a common output line with each diode being connected through a pair of broadbanding stub-type filters formed in a second conductive layer. The hybrid ring serves as an impedance matching device between the input connections and the two output diode connections.

This invention relates generally to a mixer for use in a superheterdyne receiver, and more particularly to a balanced mixer constructed as a strip line for use at microwave frequencies.

Radio receivers are required in many applications wherein space is very critical. One such application is in missiles and space vehicles, and in particular for a radar transponder for such use. Such equipment operates at very high frequencies and hollow waveguides are normally used for conducting the signals. Such waveguides are bulky so that the resulting equipment is objectionably large. Also, matching transformers may be required for connection to the rectifying devices, and this further increases the size.

Another problem in connection with radio equipment for missiles and the like is that the equipment is subjected to extensive vibration, shock and acceleration. This requires a very rugged unit so that it is not damaged and rendered ineffective when subjected to such operating conditions.

It is, therefore, an object of this invention to provide a compact and rugged mixer structure for a high frequency superheterodyne receiver.

A further object is to provide a simple and improved mixer structure which is easy and inexpensive to construct.

Another object of the invention is to provide a mixer circuit for operation at very high frequencies which operates effectively over a wide band of frequencies.

A feature of the invention is the provision of a high frequency balanced mixer provided as a strip line on an insulating board engaging a first ground plane, with a second insulating board separating the line from a second ground plane, and wherein input signals and local oscillations are applied to a hybrid ring formed by the strip line to the outputs of which the rectifying diodes are coupled. The hybrid coupling ring balances out the input signals and local oscillations, respectively, at the two input points, and applies both the input signals and the local oscillations to each diode and additionally matches the impedance of the diodes to the input lines, thereby achieving maximum efficiency.

Another feature of the invention is the provision of a balanced mixer constructed as a strip line wherein recesses are provided in the insulators of the strip line to receive the diodes of the balanced mixer circuit so that the diodes are connected to the strip line. The strip line includes quarter wave-length stubs for rejecting the frequency band of the received signals, so that the entire mixer structure is provided as a flat structure.

The invention is illustrated in the drawings wherein.

Figures 1, 2, 3, 4, 5:
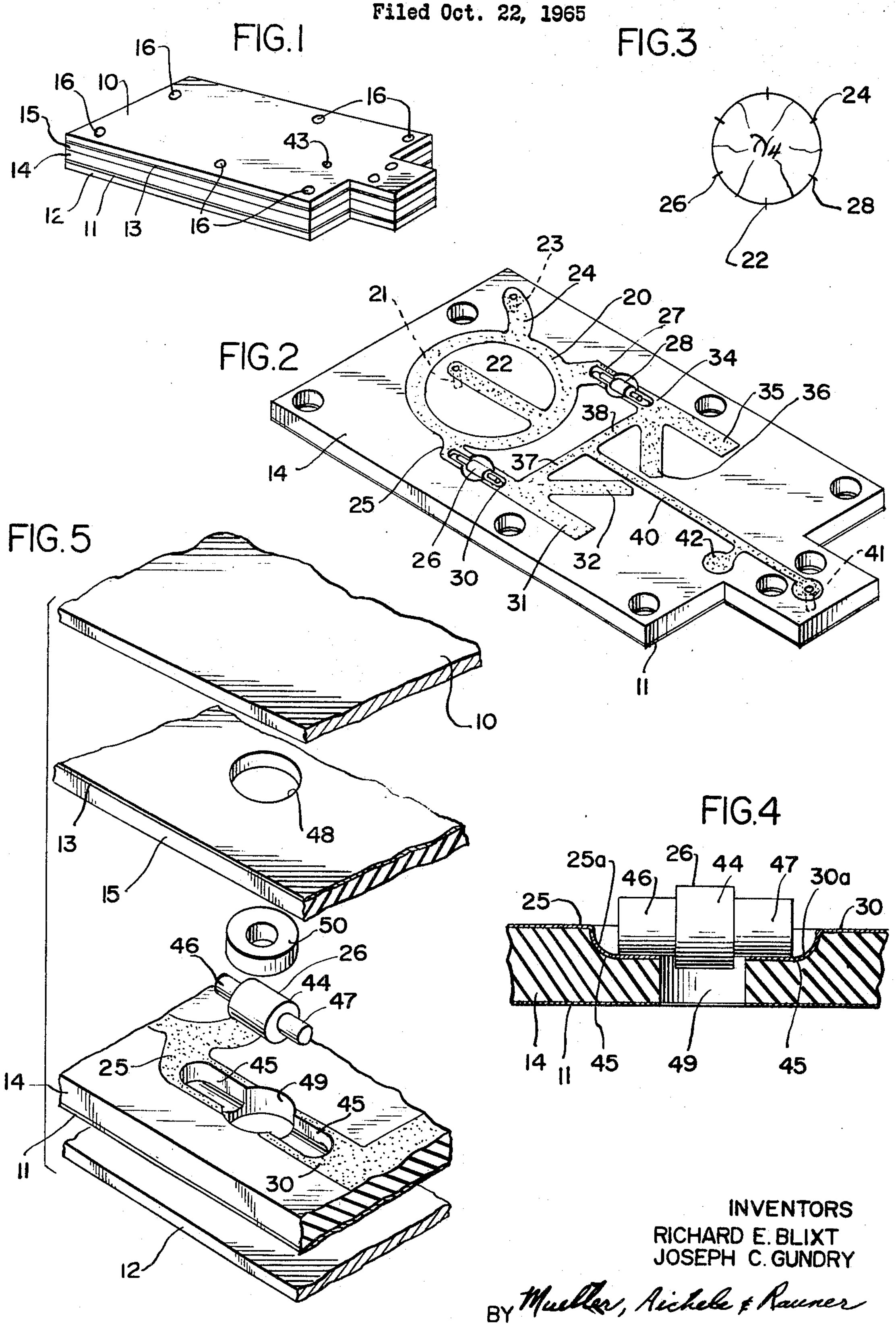
FIG. 1 is a perspective view of the complete balanced mixer unit.
FIG. 2 shows the configuration of the strip line conductor and the diodes.
FIG. 3 illustrates schematically the operation of the hybrid mixer.
FIG. 4 is a cross-sectional view showing the diode mounting.
FIG. 5 is an exploded view of the diode mounting.

The mixer structure in accordance with the invention includes a strip line provided on a first insulating board and having a first portion with the configuration to form a hybrid ring, and a second portion which forms an output circuit with a filter to reject the signal frequencies. Rectifier diodes are coupled to the hybrid ring and to the output circuit, with the hybrid ring providing impedance matching to the diodes. The insulating board has a first conducting layer forming a first ground plane, and a second insulating board is placed on the strip line conductors and spaced therefrom a second conducting layer which forms the second ground plane. Conducting walls may be positioned on opposite sides of the two boards to form a rigid structure. The two insulating boards have openings and recesses for receiving therebetween the two diodes so that the diodes are in the same plane as the strip line. A resilient washer holds the diode terminals in firm electrical contact with continuations of the strip line conductor, which are deposited in the recesses on the first board. The output filter is provided by a pair of quarter-wave-length stubs connected adjacent each diode, and providing a double tuned response to form a short circuit for the received signals and local oscillations over a relatively broad frequency band. The entire construction is held in assembled relation by screws extending from one conducting wall to the other.

Referring now to the drawing, in FIG. 1 there is shown the mixer structure which is of a sandwich configuration with top and bottom conducting walls 10 and 12 between which are positioned insulating boards 14 and 15. The boards are formed of a material having the desired dielectric properties such as the material known as Rexolite 1422 made by Brand Rex Div. of American ENKA Corp. The entire structure is held in assembled relation by screws 16 which extend from the top conducting wall 10 through the insulating boards into the bottom conducting wall 12.

The insulating board 14 is shown in FIG. 2 with the strip line conducting layer 20 thereon, which can be provided by any suitable printed circuit technique. The conducting layer 20 has a portion shaped to form a hybrid ring, with received input signals being applied through conductor 21 connected to the portion 22 of the conductive layer, and local oscillations being applied through conductor 23 connected to the portion 24. The conductors 21 and 23 extend up through openings in the conductive wall 12 and the insulating board 14 to the layer 20. The hybrid ring has output conductor portions 25 and 27 connected to terminals of diodes 26 and 28, respectively.

The terminal of diode 26 not connected to the hybrid ring is connected to the output strip line portion 30, to which are connected stub lines 31 and 32. In a similar manner the terminal of diode 28 not connected to the hybrid ring is connected to the strip line portion 34 to which stub lines 35 and 36 are connected. The two diodes are connected by conductor portions 37 and 38 respectively to the narrow output strip line 40. A conductor 41 is connected to this line and extends down through openings in the lower insulating board 14 and the lower conductive wall 10 to provide the output of the mixer. A conductive projection 42 extends from conductor 40 for making a test connection to the mixer. This is accessible through the openings 43 in the board 15 and top plate 10, and makes it possible to insert a probe to measure the diode current without removing the upper insulating board 15 and the upper conductive plate 10.

The insulating board 14 has a thin conducting layer 11 of copper or other suitable material on the side opposite the strip line conductive layer 20, and the board 15 similarly has a conducting layer 13 on the upper side thereof. The conducting layers 11 and 13 form the ground planes for the strip line. In some constructions, the layers 11 and 13 can be omitted and the conducting walls 10 and 12 allowed to serve as the ground planes. The supporting walls 10 and 12 can be formed by walls of other components of the receiver which includes the mixer, and the conducting characteristics thereof are not critical when the conducting layers 11 and 13 are used.

FIG. 3 shows the hybrid ring schematically, and illustrates the arrangement whereby the local oscillations are combined with the input signals to provide maximum combined outputs from the diodes, and minimum coupling from the local oscillator input to the signal input and vice versa. The hybrid ring has a circumference equal to one and one-half wave-lengths at the mid-band frequency of the frequency range of the received signals. As shown in FIG. 3 the circumference is effectively divided into 60 degree segments, so that each has a length equal to one quarter of a wave-length.

The following table shows the wave-length of the paths around the hybrid ring in clockwise (CW) and counterclockwise (CCW) directions, and the phase difference produced, whereby both the input signals and the local oscillations are maximum at the two diodes:

| Injection port | Pick-off port | CCW path length | CW path length | Phase difference | Combined output |
|---|---|---|---|---|---|
| Local Osc | Diode 26 | ¾ | ¾ | 0 | Max. |
| Do | Diode 28 | 1¼ | ¼ | 1 | Max. |
| Do | Input Signal | 1 | ½ | ½ | Min. |
| Input Signal | Diode 26 | 1¼ | ¼ | 1 | Max. |
| Do | Diode 28 | ¼ | 1¼ | 1 | Max. |
| Do | Local Osc | ½ | 1 | ½ | Min. |

The energy injected into the input signal port of the hybrid ring through conductor 22 and that injected into the oscillator port through conductor 24 will both split and be propagated in both directions around the ring. As shown in the above table, the two inputs are both effectively coupled by the hybrid ring to the diodes, and are greatly decoupled from each other. The hybrid ring can be constructed to provide effective impedance matching so that a transformer is not required. Accordingly, the hybrid ring provides full signal amplitude to the diodes over the operating frequency range.

To attenuate the signal input RF frequency and local oscillations at the output, the stubs 31, 32, 35 and 36 are provided. Each of these has an equivalent length of approximately a quarter of a wave-length at the mid-band frequency, and the two stubs 31 and 32 connected to diode 26 form a double tuned resonant circuit. This has a broad banding effect to greatly attenuate the signal input and local oscillator frequencies at the output of the mixer over the frequency range. Similarly, the stubs 35 and 36 form a double tuned resonant circuit at the signal and local oscillator frequencies to attenuate such signals at the output of diode 28.

The physical mounting of the diodes in the structure is shown in FIGS. 4 and 5. The insulating board 14 has a circular opening 49 therein to receive the large portion 44 of the diode 26. An elongated recess 45 extends on either side of the opening 49, and the connecting portions 25 and 30 of the strip line conductor extend down into the recess, as shown at 25*a* and 30*a*. These portions can be formed by depositing conducting material in the recesses. The terminal portions 46 and 47 of the diode extend into the recess and engage the connecting portions 25*a* and 30*a*, to thereby connect the diodes in series between the input conductor 25 and the output conductor 30.

As shown by FIG. 5, the top insulating board 15 has an opening or aperture 48 therein to receive resilient washer 50 having a center core for receiving the large portion 44 of the diode. The resilient washer 50 engages the terminal portion 46 and 47 of the diode. The washer has a thickness somewhat greater than that of the board 15. When the unit is assembled, the top plate 10 bears against the washer 50 so that the diode 26 is firmly held in position with the terminal portions 46 and 47 thereof in secured electrical contact with the connecting portions 25*a* and 30*a*.

Although FIGS. 4 and 5 show only the diode 26, the diode 28 can be supported and connected int exactly the same way.

The mixer structure provided is mechanically very rugged so that it can be used effectively in applications where vibrations, shock and acceleration are encountered. Because the structure is extremely simple, it is easy and economical to manufacture. The strip line construction makes it possible to provide a mixer useful over a relatively wide frequency band. The overall structure is small and is provided as a flat unit so that it will require a minimum amount of space when used in a receiver.

The arrangement for mounting the diodes makes it possible to connect the diodes directly to the conducting layer forming the strip line, with the connections being provided by the physical engagement therebetween. This makes it possible to provide the hybrid ring input and the output circuit in close proximity to the diodes, with the hybrid ring providing the required impedance matching. The quarter wave-length filter stubs in the output circuit require a minimum amount of space and are constructed at a minimum cost since they are formed by extensions of the conducting layer.

What is claimed is:

1. A compact strip-line type mixer apparatus adapted to heterodyne received signals and local oscillation signals of predetermined frequencies, the mixer apparatus including the combination, a first flat insulating board having first and second electrically separated conductive layers on one side thereof, said first conductive layer including a portion forming a hybrid ring having a pair of inputs for respectively receiving said signals and having first and second output connections, said input connections being spaced along said hybrid ring such that they are respectively decoupled one from the other while said output connections are spaced with respect to both of said input connections for maximizing output energy therefrom, said hybrid ring being constructed to provide effective impedance matching between said input and said output connections, a pair of diodes, each of which has a pair of elongated end portions and an enlarged electrically insulated central portion with said end portions forming electrical connections to a crystal inside the respective diode, said first flat insulating board having a pair of recesses immediately adjacent said first and second output connections with said first conductive layer extending down into each of said recesses, each recess having an enlarged portion and a pair of elongated portions for receiving one of said diodes, said second conductive layer extending from said one side into each of said recesses opposite to and spaced from said first conductive layer by the enlarged portions of each of said recesses, said iodes in said recesses being electrically connected by said end portions to said respective conductive layers in said recesses with the enlarged portion of the diodes being in the enlarged portion of said recesses respectively, said second conductive layer extending between said recesses along said hybrid ring and having an output line portion extending away from said hybrid ring with external connection means at an extreme end of said output line, said output line being relatively narrow with respect to other portions of said second conductive means, said second conductive layer further having double-tuned broad-banding low-pass filter means adjacent each of said recesses and each filter means including a pair of stubs one of which extends parallel and another toward said output line for providing low-pass filter function and broad-banding the output portion of said mixer, a second flat insulating board having a side abutting against said one side of said first flat insulating board and having a pair of large apertures over said recesses of said first flat insulating board and of such a diameter for receiving a resilient washer, a resilient washer having a thickness greater than said second flat insulating board and disposed in each said apertures such that the center core of the washer receives the enlarged portion of each of the diodes, respectively, and the resilient ring portion of the washers engaging the end portions, respectively, of said diodes for resiliently holding said diodes in said recesses, said washer being removable from said aperture for permitting access to said diodes, and means holding said first and second flat insulating boards against each other.

2. A compact strip-line type mixer apparatus adapted to heterodyne received signals with local oscillation signals having predetermined frequencies, the mixer apparatus including the combination, the first flat insulating board of generally rectangular configuration having short and long edges with first and second electrically separated conductive layers on one side thereof, said first conductive layer comprising a hybrid ring having a pair of input portions for respectively receiving said signals and having first and second output connection portions and being disposed adjacent one short edge of said first flat insulating board with said first and second output connection portions being disposed adjacent said long edges, respectively, said input portions being spaced along said hybrid ring such that they are decoupled one from the other while said output connection portions being spaced with respect to both of said input portions of maximizing output energy therefrom, said hybrid ring being constructed to provide effective impedance matching between said input and output connection portions, a pair of semiconductor diodes each of which has a pair of opposed axially aligned elongated end portions serving as electrical contacts for the diode and having an enlarged electrically insulated central portion, said first flat insulating board having a pair of recesses immediately adjacent said first and second output connection portions and disposed centrally along said long edges of said board with said first conductive layer output connection portions extending down into each of said recesses, each recess having a central enlarged portion and a pair of elongated end portions for receiving said diodes, respectively, one of said end portions in each of said recesses receiving one of said first conductive layer output connection portions, said second conductive layer extending from said one side into each of said recesses into an end portion opposite to said one end portion receiving said first conductive layer, said diodes in said recesses electrically connected by said end portions to said conductive layers, respectively, and said diode enlarged central portions disposed in said enlarged portions of said recesses, respectively, said second conductive layer having a layer portion extending between said recesses along said hybrid ring and having an output line extending from said layer portion of said second conductive layer intermediate said recesses outwardly away from said hybrid ring and including external connection means at an extreme end of said output line remote from said hybrid ring, said output line being relatively narrow with respect to widths of other portions of said second conductive means, said second conductive layer further including broad-banding low-pass filter means immediately adjacent each of said recesses and said layer portion extending therebetween and each filter means including a pair of stubs formed in said second conductive layer, one stub in each filter means extending parallel to said long edges and another extending at an angle from said recess toward said output line but not electrically connected to said output line except through said layer portion, a second flat insulating board having a side abutting said one side of said first flat insulating board and having a pair of large apertures respectively disposed over said recesses in said first flat insulating board and of such a diameter for receiving a resilient washer for holding the diodes in said recesses respectively, a resilient washer having a ring shaped portion with a hollow center core and a thickness greater than said second flat insulating board and disposed in each of said apertures such that the center core of said washer receives the enlarged portion of each of the diodes and said ring portion of the washer engaging the end portions of said diodes respectively for resiliently holding said diodes in said recesses, means holding said first and second flat insulating boards against each other, and ground plane means on said first and second flat insulating boards opposite to said sides thereof which abut each other.

References Cited

UNITED STATES PATENTS

| | | | |
|---|---|---|---|
| 2,436,828 | 3/1948 | Ring | 325—446 |
| 2,868,966 | 1/1959 | Arditi | 325—445 XR |
| 2,951,149 | 8/1960 | Grieg et al. | 325—445 XR |
| 3,310,748 | 3/1967 | Putnam | 325—446 |

KATHLEEN H. CLAFFY, Primary Examiner

R. S. BELL, Assistant Examiner

U.S. Cl. X.R.

332—43